(12) United States Patent
Takahashi et al.

(10) Patent No.: US 7,338,699 B2
(45) Date of Patent: *Mar. 4, 2008

(54) ISLAND PROJECTION-MODIFIED PART, METHOD FOR PRODUCING THE SAME, AND APPARATUS COMPRISING THE SAME

(75) Inventors: Koyata Takahashi, Sagamihara (JP); Masanori Kohgo, Fujisawa (JP); Osamu Matsunaga, Sagamihara (JP)

(73) Assignee: Tosoh Corporation, Yamaguchi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/695,802

(22) Filed: Oct. 30, 2003

(65) Prior Publication Data
US 2004/0086689 A1 May 6, 2004

(30) Foreign Application Priority Data
Oct. 31, 2002 (JP) .......................... P. 2002-317578

(51) Int. Cl.
*B32B 5/12* (2006.01)
(52) U.S. Cl. .................... 428/149; 428/141; 428/428; 428/426; 428/334; 428/332; 428/219; 428/220; 428/432; 118/728; 118/720; 118/721; 156/916; 156/914; 156/345.3; 427/448; 427/452; 65/17.3; 65/17.4
(58) Field of Classification Search ................ 428/143, 428/141, 428, 149, 426, 334, 332, 219, 229, 428/432, 220; 118/728, 720, 721; 156/916, 156/914, 345.3; 427/448, 452; 65/17.3, 65/17.4
See application file for complete search history.

(56) References Cited
U.S. PATENT DOCUMENTS
5,324,566 A * 6/1994 Ogawa et al. .............. 428/141
(Continued)

FOREIGN PATENT DOCUMENTS
EP 0 882 812 A1 12/1998
(Continued)

OTHER PUBLICATIONS
Patent Abstracts of Japan—61 056277, vol. 010, No. 219.
European Search Report dated May 18, 2004.
Magomu, Masakatsu: JIS Using Series, Spray Technique Manual, Juridical Foundation;: Japan Standard Association, Oct. 30, 1998, p. 91-93.

*Primary Examiner*—William P Watkins, III
(74) *Attorney, Agent, or Firm*—Sughrue Mion, PLLC

(57) ABSTRACT

In film-forming devices and plasma-processing devices, filmy matter adheres to the surfaces of the inner parts and it peels to cause dust and particles in the devices. In the devices, the dust and particles contaminate the objects for film formation thereon or the objects to be processed with plasma. For preventing the objects from being contaminated with them, the inner parts of the devices must be frequently exchanged every time when they have received any minor filmy matter thereon, and this lowers the productivity in the devices. When a modified glass part of which the surface is modified with spherical or bell-like island projections having a width and a height of from a few μm to a few hundreds μm is used in a film-forming device and in a plasma-processing device, then its ability to hold the filmy substance having adhered thereto is good and its resistance to plasma is also good. Therefore, the surface-modified part does not produce dust and particles and solves the problem of contamination of products. In addition, since the surface-modified part of the type has few pores and therefore releases few particles and little gas. Moreover, since the stress to be caused by the thermal expansion difference between the island projections and the substrate of the surface-modified part is small, the part does not peel even when heated, and it is favorable to vacuum devices.

17 Claims, 6 Drawing Sheets

U.S. PATENT DOCUMENTS

| | | | | |
|---|---|---|---|---|
| 6,120,640 | A * | 9/2000 | Shih et al. | 156/345.1 |
| 6,150,006 | A * | 11/2000 | Hellmann et al. | 428/141 |
| 6,221,504 | B1 | 4/2001 | Pfeffinger et al. | |
| 6,319,419 | B1 * | 11/2001 | Ohhashi et al. | 216/56 |
| 6,458,445 | B1 * | 10/2002 | Inaki | 428/141 |
| 6,706,205 | B2 * | 3/2004 | Gorczyca et al. | 216/53 |
| 6,777,045 | B2 * | 8/2004 | Lin et al. | 428/34.6 |
| 6,902,814 | B2 * | 6/2005 | Takahashi et al. | 428/432 |
| 2003/0091835 | A1 * | 5/2003 | Takahashi et al. | 428/432 |
| 2004/0018361 | A1 * | 1/2004 | Takahashi et al. | 428/428 |
| 2005/0084654 | A1 * | 4/2005 | Takahashi et al. | 428/143 |

FOREIGN PATENT DOCUMENTS

| | | |
|---|---|---|
| EP | 1 310 466 A2 | 5/2003 |
| JP | 58-003964 A | 1/1983 |
| JP | 04268065 A * | 9/1992 |
| JP | 9-176818 | 8/1997 |
| JP | A 11-106225 * | 4/1999 |
| JP | 11-340143 | 12/1999 |
| JP | 2001-152310 A | 6/2001 |
| JP | 2001-152317 A | 6/2001 |
| JP | 2001-192818 A | 7/2001 |
| JP | 2001-335913 A | 12/2001 |
| JP | 2002-115065 A | 4/2002 |

* cited by examiner

ISLAND PROJECTION-MODIFIED PART, METHOD FOR PRODUCING THE SAME, AND APPARATUS COMPRISING THE SAME

FIELD OF THE INVENTION

The present invention relates to an island projection-modified part which is used in, for example, film-forming devices and plasma-processing devices (plasma-etching devices, plasma-cleaning devices, etc.) for production of semiconductors, etc. When used in these devices, the part releases little gas and gives no dust.

DESCRIPTION OF THE RELATED ART

In the art of production of semiconductors, etc., heat-resistant and readily-workable glass parts, for example, reactor tubes or bell jars of quartz glass or heat-resistant glass are essentially used in forming CVD films of polysilicon, silicon oxide, silicon nitride or the like. In the film-forming process, filmy matter adheres not only to the intended substrate for film formation thereon but also to the machine parts such as reactor tubes and bell jars. As a result, the filmy matter having adhered to the reactor tube and the bell jar becomes thick after repeated film-forming operations, therefore causing problems in that the reactor tube and the bell jar may be cracked owing to the thermal expansion difference between the matter and quartz glass and the filmy matter may peel off to form dust and contaminate the substrate. In film formation through PVD of titanium nitride or tantalum nitride, used are metal or ceramic shield parts, and these also have the problems in that the filmy matter having adhered thereto after repeated film-forming operations becomes thick and peels off to form dust and contaminate substrates. In addition, plasma-etching devices and plasma-cleaning devices also have the problems in that the filmy matter having adhered to the machine parts of the devices also becomes thick and peels off to form dust and contaminate substrates.

To solve the problems, for example, there is proposed a plasma-cleaning device of applying a negative bias to the object to be processed (for example, U.S. Pat. No. 5,460,689). Even in such a plasma-cleaning device, however, the particles having scattered in the process of etching the object may adhere to the inner parts of the device to form a filmy deposit thereon, and with the increase in the number of the objects processed, the filmy deposit peels off and contaminates the processed objects.

For enhancing the ability of machine parts to keep the filmy matter deposited thereon, proposed are a method of forming a plasma spray film of Mo, W, Al, WC or the like on the surface of a machine part to thereby disperse the inner stress of the filmy deposit and increase the filmy matter deposition area so as to prevent the filmy deposit from peeling away from the part (for example, JP-A-60-120515 and JP-A-4-268065). Also proposed is a method of coating a machine part of quartz glass with an insulating film that is more anticorrosive to plasma than quartz, for example, by forming thereon an alumina-based ceramic film through detonation flame spraying (for example, JP-A-8-339895). However, the parts of quartz glass coated with a film except quartz glass (e.g., Mo, W, Al, WC, alumina) are still problematic in that the coating film itself readily peels off owing to the difference in the thermal expansion coefficient between quartz glass and the coating film.

On the other hand, for solving the problem with the filmy deposit that may peel away from the machine parts of film-forming devices, plasma-etching devices and plasma-cleaning devices, proposed are a quartz glass part of which the surface is roughened through blasting, and a quartz glass part that is blasted and then acid-etched (for example, JP-A-10-59744). However, the quartz glass parts processed through blasting have mircocracks in the roughened surfaces thereof, and they are therefore problematic in that the fragments of the parts that start from the microcracks thereof are to be dust (impurities) in the devices. Another problem with the parts having microcracks formed in their surfaces is that their life is short since their mechanical strength is low. Still another problem is that, when impurities enter the microcracks of the parts, then they may devitrify the parts. The problem of fragmentation to give dust (impurities) may be overcome in some degree when the quartz glass parts are blasted, then acid-etched and heated for surface fusion, but this is still unsatisfactory (for example, JP-A-9-202630 and JP-A-2003-212598). On the other hand, when the quartz glass parts that have been surface-roughened through blasting are repeatedly washed with nitric acid/hydrofluoric acid for removing the filmy deposit from them, then it causes a problem in that the roughened surfaces of the parts become smoothed and filmy matter adhering to the thus-smoothed surfaces of the parts may readily peel away to form particles.

Apart from the above, also proposed is a method of roughening the surfaces of quartz glass parts not through mechanical treatment but through chemical treatment alone (for example, JP-A-11-106225 and JP-A-2002-68766). Chemical treatment does not form microcracks in the surfaces of the parts processed through it and is therefore free from a problem of contamination to be caused by them. However, since the surface roughness attainable by chemical treatment is small and is insufficient for preventing filmy deposits from peeling away from the surface-roughened parts. Another problem with chemical treatment is that the properties of the processing chemical used may change in time with the increase in the number of treatment operations and therefore it is difficult to stably treat machine parts through chemical treatment.

On the other hand, a glass tool having a specific surface profile is proposed. This has small projections having a width of from 70 to 1000 μm and a height of from 10 to 100 μm, uniformly distributed on its surface (for example, JP-A-2002-110554). Regarding the surface profile produced according to the method, cracks are formed in the surfaces of the projections and it is seen that small projections are formed on the surfaces of the large projections formed on the tool surface. The projections of the type are formed through chemical dissolution with an acid that contains hydrofluoric acid, and many of the large projections are gently-sloping ones. Therefore, the surface profile of the glass tool proposed is not always satisfactory for preventing filmy deposits from peeling away from the tool. In addition, the fine projections existing on the surfaces of the base projections or the cracks of the base projections may cause plasma field concentration around them and cause peeling of the base projections, and, as a result, they may cause particles by themselves. In particular, when the tool is, after used, washed with acid and is used again, the fine projections on it will be etched away and the peeled projections may cause a serious problem of formation of particles in repeated washing.

SUMMARY OF THE INVENTION

In the technical field of the invention in which film-forming devices or plasma-processing devices are used, it is an extremely important theme to prevent the formation of dust (impurities) and particles that may be caused by peeling of filmy deposits from the inner parts of the devices.

The present invention relates to a thermal spray film-modified part which is for film-forming devices or plasma-processing devices. The advantages of the part of the invention are that a filmy deposit formed on it is hardly peeled away from it, the part gives few particles and little gas, and the sprayed film on it does not peel off from the substrate thereof.

The present invention also relates to a method for producing the part and a device that comprises the part.

Taking the current situation as above into consideration, as a result of extensive investigations, it has been found that an island projection-modified part having island projections of glass formed on a substrate thereof, especially having spherical or bell-like island projections of glass formed thereon through plasma spraying releases little gas from its projections, that the projections do not peel off from the substrate therefore giving no particles and that the ability of the thus-modified part to hold a filmy deposit thereon is good. Further, it has been found that, even when the part is washed with acid after its use, it still keeps its surface projection profile and therefore keeps its ability to inhibit particle formation and to hold a filmy deposit thereon. Further, it has been found that the glass island projection-modified part may be produced in a process of plasma spraying of a glass material onto a substrate, in which the amount of the glass material to be plasma-sprayed onto the substrate is at most 20 mg/cm$^2$.

It has further been found that the island projection-modified part having, on its substrate, ceramic and/or metal-sprayed bell-like island projections has the advantages in that it releases little gas from its projections, the projections do not peel off from the substrate under heat and do not give particles, and the ability of the part to hold a filmy deposit thereon is good. It has still further been found that the island projection-modified part of the type can be produced by making a semi-melt spray powder thermally collide with a substrate, or by forming a powder of particles of a high-melting-point material enveloped in a low-melting-point material and then making the powder thermally colloid with a substrate in such a condition that the low-melting-point material is completely melted but the high-melting-point material is un-melted or semi-melted while the powder is thermally sprayed on the substrate.

In addition, it has further been found that, in a film-forming device, a plasma-etching device and a plasma-cleaning device that comprise the island projection-modified part of the invention, particles are prevented from forming therein. The present invention has been completed based on those findings.

Figure 1:
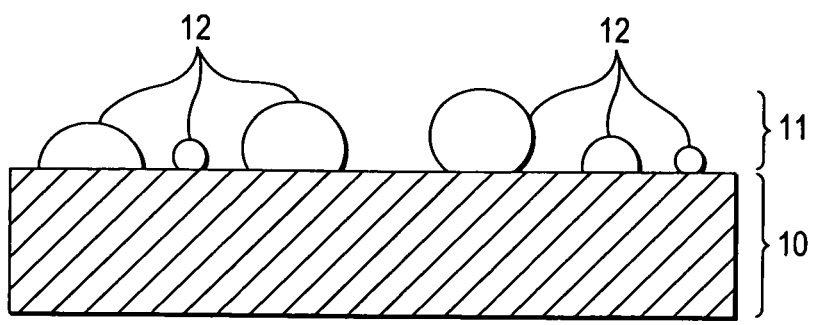
FIG. 1 is a schematic view showing the structure of an island projection-modified part of the present invention.

In the drawings:
10: Substrate
11: Surface-Modifying Layer
12: Spherical Projection
40: Substrate
41: Surface-Modifying Layer
42: Bell-like Projection
70: Substrate
71: Glass-Sprayed Undercoat Layer
72: Surface-Modifying Layer
80: Cathode
81: Anode
82: Plasma Gas
83: Spraying Powder (feed nozzle)
84: Spray Distance
85: Substrate
86: Glass-Sprayed Film
87: Power Source
90: Cathode
91: Anode
92: Plasma Gas (feed nozzle)
93: Spraying Powder (feed nozzle)
94: Spray Distance
95: Substrate
96: Glass-Sprayed Film
97: Plasma Gas (feed nozzle)
98: Main Power Source
99: Auxiliary Power Source
100: Substrate
101: Semispherical Bell-like Island Projection
102: Roundish Bell-like Island Projection
103: Width of Bell-like Island Projection
104: Height of Bell-like Island Projection
110: Substrate
111: Disc-like Island Projection
112: Width of Disc-like Island Projection
113: Height of Disc-like Island Projection
120: Substrate with negative roughness skewness
121: Bell-like Island Projection
130: Substrate with positive roughness skewness
131: Bell-like Island Projection 132: Partly-Splashed Bell-like Island Projection
133: Pore
140: Substrate
141: High-Melting-Point Material
142: Low-Melting-Point Material
143: Bell-like Island Projection
150: Spray Gun
151: Spraying Flame
152: Spraying Powder
153: Un-melted Part of Flying Particle
154: Melted Part of Flying Particle
155: Nucleus of Bell-like Island Projection formed of un-melted part of sprayed particle
156: Skin of Bell-like Island Projection formed of melted part of sprayed particle
157: Substrate
158: Spray Distance

DETAILED DESCRIPTION OF THE INVENTION

The present invention is described in detail below.

The island projection-modified part of the invention has island projections formed on an uncoated substrate or a glass-sprayed substrate.

Figure 4:
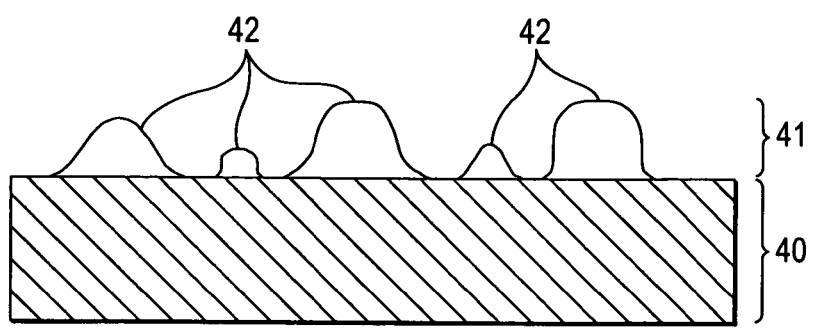
FIG. 4 is a schematic view showing the structure of an island projection-modified part of the present invention.

FIG. 1 and FIG. 4 are schematic views each showing a glass-modified part that has island projections of glass on a substrate. The island projection-modified part of the present invention has spherical island projections or bell-like projections of glass on a smooth glass substrate 10 or 40. In the present invention, these projections are independent of each other like islands. Some of the island projections may overlap with each other, and the spherical or bell-like projections are mutually connected with each other to form a film as a whole.

The spherical island projections as referred to herein are not limited to strictly-defined spheres, but include partly-deleted spheres, semi-spheres and all other roundish modifications like 12 in FIG. 1 In addition, they further include overlapped modifications of some of these spherical forms. Similarly, the bell-like island projections include mountain-like forms of which the upper part is semi-spherical and the width of the bottom is larger than that of the top thereof, and overlapped modifications of some of these, for example, like 42 of FIG. 4. In the present invention, these spherical or bell-like island projections of different types may exist at random or may overlap with each other. Preferably, some of these projections do not overlap with each other to form a closed void space.

The spherical or bell-like island projections in the invention are roundish as a whole, and more preferably, they do not have any sharp edge. If the projections have some sharp edge, the plasma field applied to them may concentrate around their sharp edges and the projections may be selectively etched to form particles.

Regarding the size of the island projections, one island projection preferably has a width of from 5 to 300 µm and a height of from 2 to 200 µm. Low and flattened projections having a width of smaller than 5 µm and a height of smaller than 2 µm are unfavorable since their ability to hold deposits thereon is poor. Projections having a width of larger than 300 µm and a height of larger than 200 µm may have an improved ability to hold deposits thereon, but they may be partly etched by plasma to form particles. In view of these, the size of the island projections is more preferably such that the width of one projection is from 10 to 150 µm and the height thereof is from 5 to 100 µm, even more preferably the width of one projection is from 10 to 80 µm and the height thereof is from 5 to 100 µm.

The width of the projection as referred to herein is the length of the minor axis of the oval that corresponds to the top view of the island projection, and the height thereof is the length from the bottom to the top of the projection.

The number of the island projections falls between 20 and 5,000 in the unit area of 1 $mm^2$, more preferably from 50 to 1,000 /$mm^2$. If the number is smaller than 20/$mm^2$, then the ability of the projections-modified part to hold deposits thereon will be poor; but if larger than 5,000/$mm^2$, the island projections will too much overlap with each other and form a film and, if so, closed pores will be generated and particles will be generated.

The surface island projections of the modified part of the invention significantly differ from one another in point of the height thereof, for example, as compared with the projections formed through known chemical treatment as in JP-A 2003-212598 and 11-106225. Therefore, even when the part of the invention is washed with acid, it well keeps its original surface projection profile, not losing its ability to hold deposits thereon, and can be well used repeatedly. The projections formed through ordinary chemical treatment such as those in JP-A 2002-68766 have fine additional projections on their surfaces or are cracked, and they cause particles by themselves. Different from these, the island projections in the invention do not have any fine additional projections on their surfaces and therefore give few particles.

The morphology, the size and the condition of the surface projections of the modified glass part of the present invention may be confirmed through scanning electron microscopy of the cross section or the top face of the part.

Figure 7:
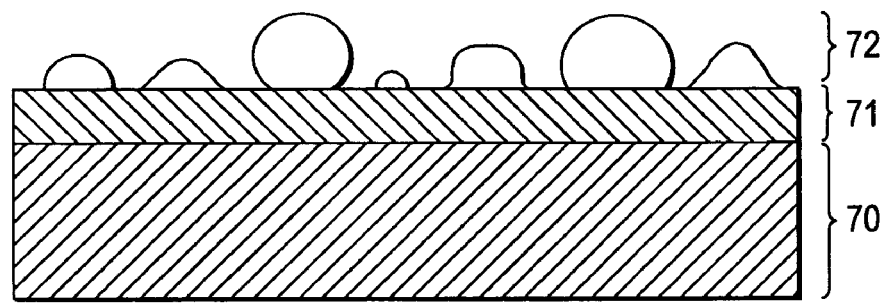
FIG. 7 is a schematic view showing the structure of a modified glass part of the present invention.

Another aspect of the island projection-modified part of the present invention has the island projections as above on a glass undercoat layer formed on the surface of a substrate. FIG. 7 is a schematic view showing this embodiment. As illustrated, an undercoat layer 71 of glass is formed on a substrate 70, and a surface-modifying layer 72 of island projections is formed on the undercoat layer. When the undercoat layer of glass is formed on the surface of the substrate as in this case, diffusion of impurities from the substrate may be prevented and, in addition, even when the substrate surface has some defects, the undercoat layer may cover them to flatten the surface to more effectively prevent the formation of particles.

Preferably, the thickness of the undercoat layer of glass is from 100 to 1000 µm. More preferably, the undercoat layer is tight and smooth, not having pores of 100 µm or larger therein. If the surface of the undercoat layer is not smooth, the height difference between the island projections formed thereon may be absorbed by the surface roughness of the undercoat layer. Concretely, for example, it is desirable that the surface smoothness of the undercoat layer is supported by the surface roughness thereof, Ra of from 1 to 5 µm.

The substrate in the invention may be glass, but may also be metal or ceramics. Of the surface-modified parts of the invention, those having an undercoat layer of glass formed through thermal spraying of glass on a substrate are free from the problem of contamination with impurities from the substrate and can exhibit the same performance as that of glass substrates.

The glass material for the island projection-modified part of the invention may be any of heat-resistant glass such as quartz glass, Vycor®, aluminosilicate glass, borosilicate glass and other non-alkali glass, or plasma-resistant glass prepared by adding a 2a or 3a element to silica. Especially the technical field of using the island projection-modified part of the present invention requires thermal impact resistance and high purity, and therefore it is desirable to use glass having a thermal expansion coefficient of at most $5 \times 10^{-6}$/K or high-purity quartz glass in the present invention.

For the island projections, the undercoat layer and the substrate, the same or different materials may be used. In case where different materials are used for them, it is desirable that the thermal expansion coefficient difference between the respective materials is at most $5 \times 10^{-6}$/K for preventing the surface-modified part of the present invention from cracking under thermal shock.

Still another aspect of the island projection-modified part of the present invention is characterized in that it has ceramic and/or metal island projections formed on its substrate and the projections have a bell-like form.

FIG. 10 shows schematic views of various island projection-modified parts of the present invention. As illustrated, the island projection-modified part of the present invention has bell-like ceramic and/or metal projections formed on a substrate 100. In the present invention, these projections are independent of each other like islands. Some of the island projections may overlap with each other. However, the bell-like projections are not mutually connected with each other to form a film as a whole. In that condition, the surface-modified part of the present invention has few pores closed by the island projections, and therefore the gas that may be released from the part of the invention is significantly reduced as compared with that to be released from a continuously thermal-sprayed film. In addition, even when the part of the invention is heated, the difference of linear expansion under heat island projections and the substrate may fall within the range of the size of the island projections since the island projections are independent of each other. Therefore, the projections hardly peel off from the substrate even under heat.

Figure 10A:
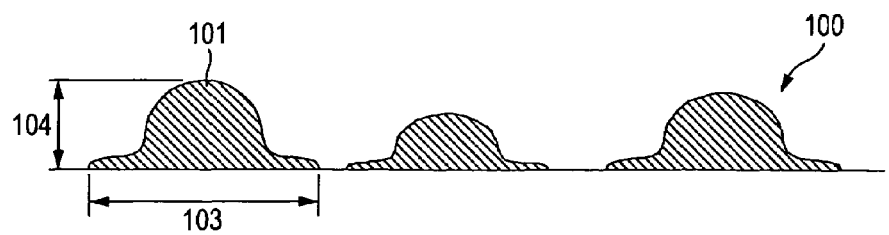
FIGS. 10A and 10B are schematic views projection-modified part of the present invention.
Figure 10B:
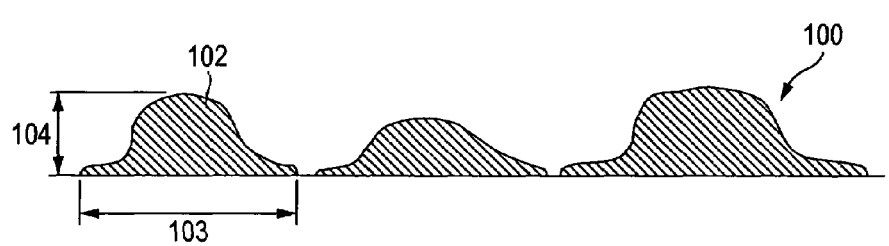

The bell-like island projections include, for example, mountain-like forms of which the upper part is semi-spherical and the width of the bottom is larger than that of the top thereof as in FIG. 10A; mountain-like forms of which the upper part is roundish and protrudes above and the width of the bottom is larger than that of the top thereof as in FIG. 10B; and overlapped modifications of some of these.

In the invention, the island projections may be formed of various materials. Preferably, the ratio of the height 104 to the width 103 of the island projection falls between 0.3 and 1.5 in terms of the mean value of different projections. If the ratio is smaller than 0.3, the ability of the modified part to hold deposits thereon will be poor; but if larger than 1.5, the adhesiveness of the island projections to the substrate may be poor. To determine the ratio of the height to the width of the projections, the size of every projection is measured in a sample that contains from 20 to 200 projections and the data are averaged. Concretely, at least 3 samples are measured in that manner and all the data are averaged. To measure the size of the projections, images of the sample taken by the use of a laser confocal microscope or a scanning electron microscope may be analyzed, for which an image analyzer capable of simultaneously determining both the width and the height of each projection may be used. The width of the projection as referred to herein is the length of the minor axis of the oval that corresponds to the top view of the island projection, and the height thereof is the length from the bottom to the top of the projection.

Preferably, the substrate that is to be the support of the island projections of the surface-modified part of the invention has a surface roughness Ra of at most 5 μm and its roughness skewness is negative. The roughness skewness may be determined as follows: Using a surface roughness profiler, a substrate sample having a length enough for the surface roughness measurement standard of JIS or ANSI is analyzed to determine the surface roughness profile thereof. Thus analyzed, the surface roughness skewness, Rsk of the sample is represented by the following formula (1) in which Rq indicates the RMS surface roughness of the sample and Rtp indicates the mean value within the measurement range of the values obtained by raising the difference between the height and the center line height at each measurement point of the sample to the 3rd power.

$$Rsk = Rtp/Rq^3 \qquad (1).$$

Figure 12:
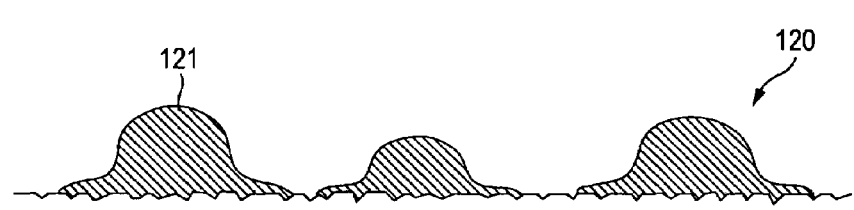
FIG. 12 is a schematic view showing the structure of an island projection-modified part of the present invention in which bell-like island projections are formed on a substrate having a negative skewness.
Figure 13:
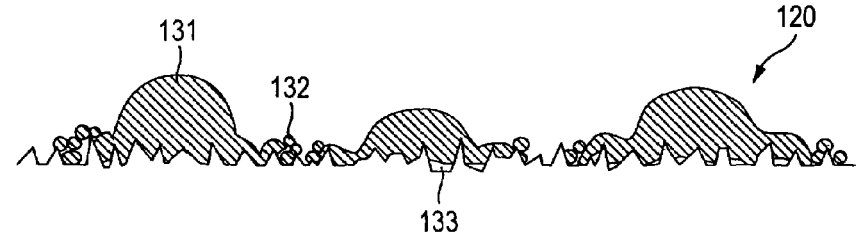
FIG. 13 is a schematic view showing the structure of an island projection-modified part of the present invention in which bell-like island projections are formed on a substrate having a positive skewness.

In general, the positive skewness means that the mountains are steep and the valleys are broad, or that is, this indicates poor slidability of the substrate surface. On the other hand, the negative skewness means that the mountains are broader than the valleys and are gently-sloping, or that is, this indicates good slidability of the substrate surface. As in FIG. 12 that shows a schematic view of island projections formed on a substrate, the substrate surface having a negative skewness enables the sprayed melt to smoothly spread to give bell-like projections 121 thereon. As illustrated, the projections 121 all have a smooth surface and have a disc-like form with its center part swollen. On the other hand, when the surface roughness Ra of a substrate is larger than 5 μm, or that is, the substrate has a positive skewness, then the surfaces of the island projections formed thereon are roughened as in the schematic view of FIG. 13. Concretely, the spray melt may spatter on the substrate while it spreads thereon to form drops 132 around the projections, or the circumference of the projections is roughened to have pores 133 around them.

The substrate for use in the invention may be any of glass, metal, ceramics and the like. The same material may be used for the island projections and the substrate, for which, however, different materials may also be used.

Regarding the metal or ceramic materials to form the island projections in the invention, the metal may be any of Al, Ti, Cu, Mo or W; and the ceramic may be any of alumina, zirconia, titania, spinel or zircon. Preferred are the material having a high melting point as the ratio of height to width of the projections is readily controlled in the thermal spraying process of forming them.

Figure 14:
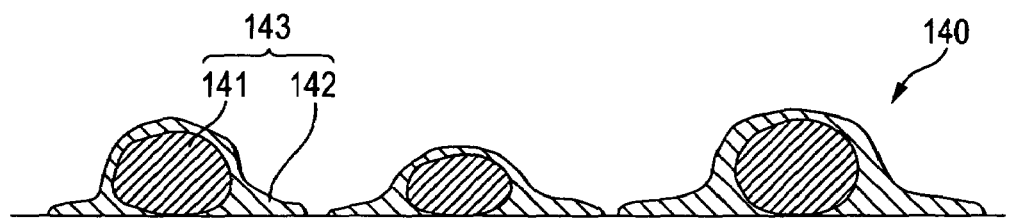
FIG. 14 is a schematic view showing the structure of an island projection-modified part of the present invention in which bell-like island projections are formed of a high-melting-point material enveloped in a low-melting-point material.

In still another aspect of the island projection-modified part of the invention, the island projections may be formed by enveloping a high-melting-point material in a low-melting-point material and they may have a bell-like form. FIG. 14 is a schematic view showing this embodiment. As illustrated, island projections 143 are formed by enveloping a high-melting-point material 141 in a low-melting-point material 143, on a substrate 140. Preferably, the difference in the melting point between the low-melting-point material 142 and the high-melting-point material 141 is at least 400° C. In that condition, the height of the island projection 143 may be controlled by the height of the high-melting-point material 141, and the island projections may be reproduced more efficiently. Examples of the low-melting-point material and the high-melting-point material are Al and Mo, and Cu and W of which the both are metals; and alumina and zirconia, and cordierite and alumina of which the both are ceramics. As the case may be, metal and ceramic may be combined. For example, combinations of Al and boron nitride, and Co and tungsten carbide may also be used herein.

A method for producing the glass island projection-modified part of the invention is described below.

The island projection-modified part of the invention may be produced by forming island projections on a substrate in a plasma-spraying process, in which the amount of the glass material to be applied to the substrate is controlled to fall between 1 and 20 mg/cm$^2$ relative to the surface area of the substrate. Naturally, the optimal value of the amount varies depending on the type of the glass material used.

In the plasma-spraying process, if the amount of the material applied to the substrate is larger than 20 mg/cm$^2$ relative to the surface area of the substrate, then the island projections formed will too much overlap, and if so, the profile of the film formed will differ from that to be formed in the invention. On the other hand, if the amount of the material applied to the substrate is smaller than 1 mg/cm$^2$, it is unfavorable since the island projections formed will be too small and the projections-forming speed is low. Preferably, the amount of the material to be applied to the substrate is from 5 to 10 mg/cm$^2$.

To form the island projections, the material may be sprayed on the substrate in different times. Preferably, however, the island projections are formed in one spraying operation in which the material is sprayed on the substrate all at a time. When the material is sprayed on the substrate in different times, the island projections formed may more readily overlap to form a tight film. In that case, therefore, the material-spraying speed must be lower than that in the other case where the material is sprayed on the substrate all at a time. After the island projections are thus formed on the substrate, it is desirable that the substrate surface is exposed to plasma jets with no material applied thereto. This is for removing the particles having adhered on the substrate surface and for improving the adhesiveness of the island projections to the substrate.

The island projections of the island projection-modified part of the invention may be formed in any thermal spraying method assisted by flame or plasma. For forming them, preferred is a plasma spraying method in which the surface of the substrate or the surface of the undercoat glass layer formed on the substrate is melted by the action of plasma jets applied thereto. While the surface of the substrate or the undercoat glass layer is thus melted, a material to form projections is thermally sprayed on the surface, whereby the adhesiveness of the thus-formed island projections to the substrate or to the undercoat glass layer may be increased. After once the island projections have been formed thereon, the substrate may be successively exposed to plasma jets to melt it. This is effective for further increasing the adhesiveness of the island projections to the substrate.

Figure 8:
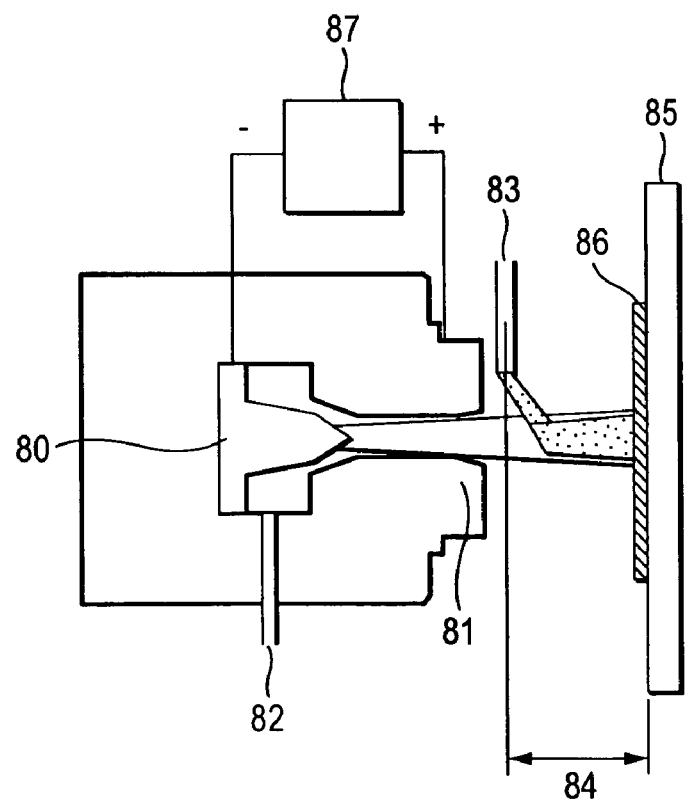
FIG. 8 is a view showing one example of an ordinary plasma spraying device.

The distance between the substrate and the plasma gun from which plasma jets are applied to the substrate varies depending on the plasma jet device used. For example, when an ordinary plasma jet device as in FIG. 8 is used, the spray distance between the substrate and the powder supply mouth at the tip of the spray gun may be 50 mm or so, and the spray powder may be at least 35 kW. On the other hand, when a reduced-pressure plasma spraying method is employed in the invention, then the distance between the substrate and the spray gun may be 100 mm or more since the gun may produce long plasma jets.

Figure 9:
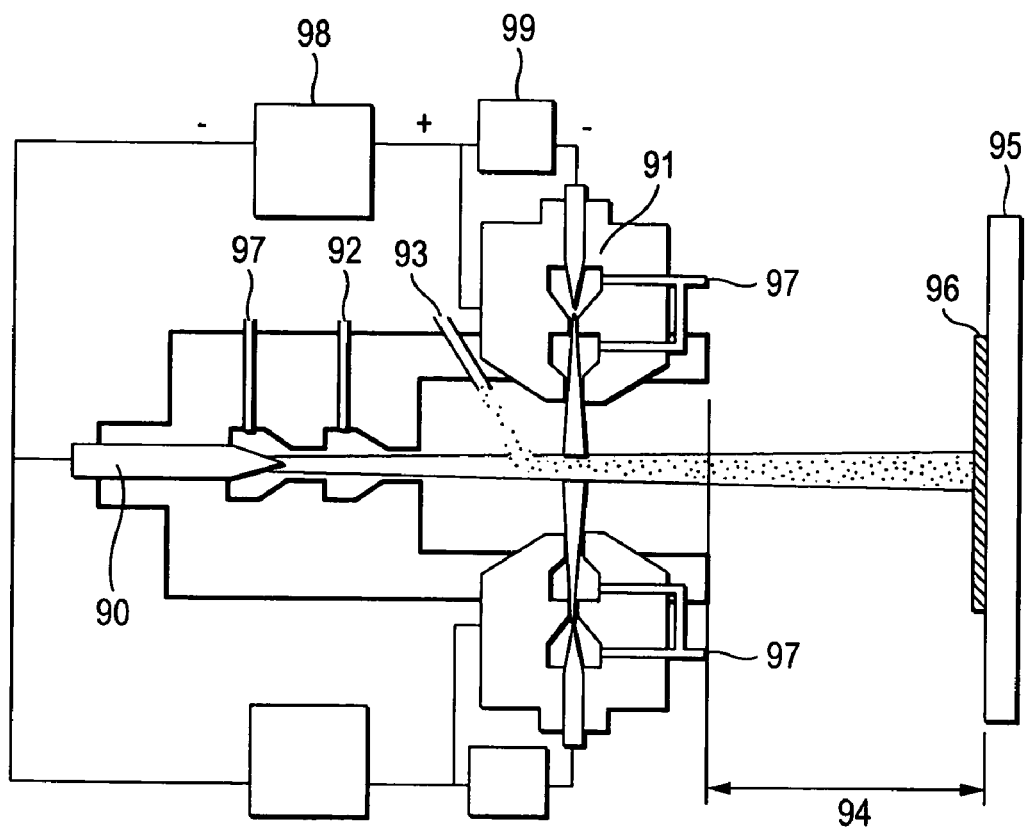
FIG. 9 is a view showing one example of a multi-torch plasma spraying device.

In particular, when a large-size glass-modified part is produced in the invention, preferably used is a multi-torch plasma spraying device (for example, see JP-B 6-22719; *Thermal Spraying Technology*, Vol. 11, No. 1, pp. 1-8, 1991) in the plasma spraying method as above. Using the device, a laminar flow of plasma jets may be applied to the substrate. FIG. 9 shows an outline of the multi-torch plasma spraying device. In the multi-torch plasma spraying device, the island projections as in the invention may be formed even though the spray distance is 100 mm or more since the device may form a laminar flow of plasma flames having a length of a few hundreds mm (generally having a length of 50 mm in a turbulent flow condition thereof).

Preferably, the mean particle size of the glass, ceramic or metal particles that are for producing the island projections is from 10 μm to 100 μm, more preferably from 10 μm to 50 μm. If the mean particle thereof is smaller than 10 μm, the powdery material is not satisfactorily flowable and will be difficult to uniformly introduce into plasma flames. On the other hand, if the mean particle size thereof is larger than 100 μm, the particles sprayed into flames would melt unevenly and, if so, the adhesiveness of the island projections formed to the substrate will be poor. It is desirable that the size of the particles to be thermally sprayed is as uniform as possible in order to form uniform island projections on the substrate and to enhance the ability of the surface-modified part to hold filmy deposits thereon.

Preferably, the substrate surface is preheated in the invention. Preheating the substrate surface is effective for increasing the adhesiveness of the island projections formed to the substrate. If the substrate is not preheated, then the adhesiveness of the island projections formed thereto will be low and, if so, when the surface-modified part is washed with an acid etchant to remove the deposits from it after use, the island projections may readily peel off from the substrate. The preheating temperature varies depending on the type of the substrate used. For example, it preferably falls between 700 and 1500° C., more preferably between 800 and 1200° C. for preheating quartz glass substrate. If the preheating temperature is too high, it is unfavorable since glass will crystallize and the substrate may devitrify or deform.

For the island projection-modified part of the invention, the substrate may be undercoated with glass. The substrate to be undercoated with glass may be not only a glass substrate but also a metal or ceramic substrate. The method of forming the undercoat layer on the substrate is not specifically defined, for which, for example, herein also employable is plasma spraying.

For forming the undercoat layer in a mode of plasma spraying, for example, employable is the devices and the conditions illustrated in FIG. 8 and FIG. 9. Concretely, the amount of the powdery material to be sprayed on the substrate is at least 20 mg/cm$^2$, and the thermal spraying operation is repeated a few times. The others may be the same as those in the process of forming the island projections as above. The surface of the undercoat layer is preferably smooth. Therefore, it is desirable that the undercoated substrate is exposed to plasma jets with no material sprayed thereon so as to melt the surface of the undercoat layer.

For forming the island projections, also employable is a combination of a sol-gel process of using a silicon alkoxide solution and the plasma spraying method as above. For example, silica particles of from a few μm to a few hundreds μm in size are dispersed in a silicon alkoxide solution and applied to a substrate to pre-form an undercoat layer of silica and island projections thereon, and the thus-processed surface of the substrate is exposed to plasma jets according to the plasma spraying method as above. In that manner, the same glass-modified surface as above may also be formed on the substrate. When edged silica particles are used, the particles-coated surface of the substrate must be indispensably exposed to plasma jets through plasma spraying. This is because, if not exposed to plasma jets, spherical or bell-like island projections that are characteristic of the invention could not be formed, or that is, the intended roundish and edgeless projections could not be formed. Even when spherical silica particles are used, it is desirable that the particles-coated surface of the substrate is also exposed to plasma jets in order to further increase the adhesiveness of the island projections formed to the substrate.

If desired, the island projection-modified part of the invention may be washed with acid after the formation of the island projections on the substrate to thereby remove fine particles from the part. In the invention, the island projections may be formed on the substrate through the operation of plasma spraying to give the intended island projection-modified part, not forming any superfluous fine projections on the surfaces of the island projections formed. However, after the plasma-spraying operation, fine invisible deposits may remain on the surfaces of the island projections. If such fine deposits are kept remaining thereon, they may drop off from the surface-modified part during the use of the part, and will cause particles and impurities. Therefore, after the island projections are formed thereon through plasma spraying; the surface-modified part is washed with acid to completely remove the deposits from it. Preferably, hydrofluoric acid or nitric acid is used as the washing liquid for the acid washing.

Figure 11:
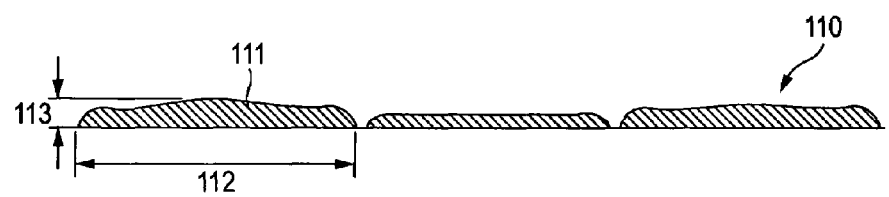
FIG. 11 is a schematic view showing the structure of a disc-like island projection-modified part.
Figure 15:
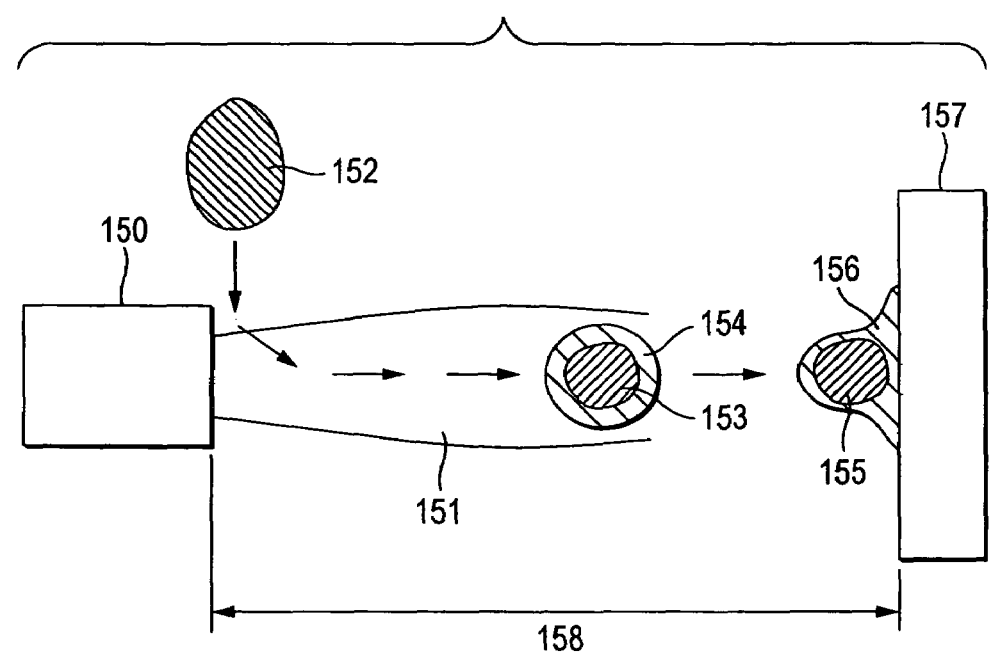
FIG. 15 is a schematic view showing a method for producing a bell-like island projection-modified part of the present invention.

As so mentioned hereinabove, the island projection-modified part of the invention may be produced by forming island projections on the substrate in a mode of thermal spraying. For forming the island projections, the amount of the powder to be thermally sprayed on the substrate is reduced to be smaller than the ordinary one so that the island projections formed do not overlap to form a continuous film. In addition, the powder to be thermally sprayed on the substrate is kept semi-melted while it is dashed on the substrate. In that manner, bell-like island projections having a disk-like form with the center thereof swollen may be formed. The thermal spraying method to be employed herein may be any of plasma spraying or flame spraying. Preferably, the powder to be sprayed on the substrate is kept semi-melted by controlling the spray power and also the flame power, for example, as in FIG. 15. Specifically, the center part of the powder to be sprayed is kept un-melted (153) while the peripheral part thereof is kept melted (154), as illustrated. In this case, when the spray power and the flame power are increased, then the powder will be completely melted to form disc-like island projections 111 as in FIG. 11, and the ability of the thus surface-modified part to hold filmy deposits thereon will be poor.

Another method for producing the island projection-modified part of the invention comprises forming a powder of particles of a high-melting-point material enveloped in a low-melting-point material and then making the powder thermally colloid with a substrate in such a condition that the low-melting-point material is completely melted but the high-melting-point material is un-melted or semi-melted while the powder is thermally sprayed on the substrate.

As so mentioned hereinabove, it is desirable that the substrate to be the support of the island projections of the surface-modified part of the invention has a surface roughness Ra of at most 5 µm and its roughness skewness is negative To make it have a surface roughness Ra of at most 5 µm and have a negative roughness skewness, the substrate may be polished with a rough abrasive by the use of a grinder or a sander, or after polished to have a smooth surface, the substrate may be lightly roughened by blasting, or after roughened by blasting, the substrate may be lightly polished by the use of a grinder or a sander to remove the projections that greatly protrude from the center line of the substrate.

The adhesiveness of the island projections to the substrate having a higher surface roughness is higher. As so mentioned hereinabove, however, the melt spray directed toward the substrate having such a high surface roughness may spatter on the substrate while it spreads thereon, or the island projections formed of it on the substrate may have corrugated surfaces and may contain pores therein. If the substrate surface is preheated, then the spray melt may smoothly spread thereon and the adhesiveness of the island projections formed to the substrate may increase. The preheating temperature varies depending on the type of the substrate and the spraying material. For example, it may fall between 100 and 500° C., preferably between 200 and 400° C. when metal is sprayed on a stainless substrate. If the preheating temperature is too high, it is unfavorable since the substrate may deform or crack.

After formed on the substrate through thermal spraying as above, the island projections are preferably heated thereon. In the island projection-modified part of the invention thus processed, the adhesiveness of the island projections to the substrate that has a low surface roughness and is smooth is good. The temperature for the heat treatment is as high as possible, not overstepping the range of the temperature to which the substrate is resistant and the range of the melting point of the island projections.

The invention also provides a film-forming device that comprises the island projection-modified part mentioned hereinabove.

The film-forming method for the film-forming device of the invention is not specifically defined. It includes, for example, CVD (chemical vapor deposition) and sputtering. Regarding the mode of using it in the device, the island projection-modified part of the invention is preferably used for the part of the film-forming device that may receive a filmy deposit formed thereon except for the substrate on which the intended film is to be formed in the device. For example, the part includes a reactor tube and a bell jar. In particular, when a reactor tube or bell jar of quartz having a surface-modifying layer of the invention or an undercoat layer of quartz glass is used in a CVD film-forming device in which a film of polysilicon, silicon oxide, silicon nitride or the like is formed at a high temperature of from 600 to 1,000° C. or so, then it will be free from a problem of cracking or layer delamination that may be caused by the thermal expansion difference between the substrate and the undercoat layer or the modifying layer, and, as a result, the filmy deposit having adhered to the part does not peel off to give particles. Accordingly, the film-forming device of the type ensures long-term continuous film formation therein.

The invention also provides a plasma-etching device and a plasma-cleaning device that comprises the island projection-modified part of the invention with the glass surface-modifying layer mentioned above. Regarding the mode of using it in these devices, the island projection-modified part is preferably used for the part of the device that may receive a filmy deposit formed thereon or for the part of which the surface layer may be delaminated through contact with plasma. For example, it may be used for a ring-shaped focus part or a bell jar.

Also preferably, the island projection-modified part of the invention is used for the part of the device that may receive a filmy deposit formed thereon except for the substrate on which the intended film is to be formed in the device. For example, it may be used for a bell jar or a shield. In particular, when the island projection-modifying layer of the invention is used for a bell jar or a shield in a CVD device of forming a film of tungsten or titanium or in a sputtering device of forming a titanium oxide film, then it will be free from a problem of cracking or layer delamination that may be caused by the thermal expansion difference between the substrate and the modifying layer, and, as a result, the filmy deposit having adhered to the part does not peel off to give particles. Accordingly, the film-forming device of the type ensures long-term continuous film formation therein.

The invention also provides a plasma-etching device and a plasma-cleaning device that comprises the island projection-modified part of the invention with the island projection-modifying layer mentioned above. Regarding the mode of using it in these devices, the island projection-modified part is preferably used for the part of the device that may receive a filmy deposit formed thereon or for the part of which the surface layer may be delaminated through contact with plasma. For example, it may be used for a ring-shaped clump part or a shield.

The plasma-etching device and the plasma-cleaning device are those in which an object is exposed to plasma so that it is etched or cleaned therewith.

The part of the plasma-etching device that may receive a filmy deposit formed thereon is meant to indicate the part of the device which, when the object therein is etched through exposure to plasma therein, may receive the substance released from the etched object to scatter therearound and which therefore may have a deposit thereon. The part of the device that may be etched through exposure to plasma is meant to indicate the part thereof that is contacted with plasma to be etched except the object to be processed in the device. Naturally in the plasma-etching device, plasma is directed to the object that is processed therein so that the surface of the object is etched, but it is difficult to selectively expose the object alone to plasma in the device. As a result, the parts of the device around the object are also exposed to plasma and they may be thereby etched. When the surface-modified part of the invention is used for those parts of the device, then the parts are hardly etched with plasma and the resulting particles could be reduced.

The part of the plasma-cleaning device that may receive a filmy deposit formed thereon is meant to indicate the part thereof which, when an object therein is exposed to plasma so as to be cleaned through back sputtering therewith, may receive the substance released from the cleaned object to scatter therearound and which therefore may have a deposit thereon. Both for the plasma-cleaning device and the plasma-etching device, the principle of etching the surface of the object in the device through exposure to plasma is basically the same. The part of the plasma-cleaning device that is to be back-sputtered through exposure to plasma as referred to herein is meant to indicate the part thereof that is contacted with plasma for back sputtering (cleaning by etching) except the object to be processed in the device. Naturally in the device, plasma is directed to the object that is processed therein so that the surface of the object is cleaned, but it is difficult to selectively expose the object alone to plasma in the device. As a result, the parts of the device around the object are also exposed to plasma and they may be thereby cleaned.

The device that comprises the island projection-modified part of the invention gives no initial particles and ensures good retentiveness of the deposit formed on the inner parts thereof in a process of plasma treatment in the device. In addition, the particles that may result from the deposit on the inner parts of the device are reduced, and the continuous running term of the device is thereby prolonged.

The advantages of the island projection-modified part of the invention and the device comprising it are mentioned below.

(1) Since the ability of the part to hold the deposit thereon is good, the part does not release the deposit and therefore does not give dust and particles when used in a film-forming device and a plasma-processing device.

(2) Since the island projections of the part are spherical or bell-shaped, the part is free from a problem of plasma field concentration to cause particles when used in a film-forming device and a plasma-processing device.

(3) When the part of glass is formed to have island projections of glass on its surface, the island projections do not have any additional fine projections therearound. Therefore, even when the part is washed with acid, the surface projections do not peel to give particles, and well keep their original shape. Accordingly, the part is usable many times repeatedly.

(4) The island projections of the part are isolated from each other on the substrate. Therefore, even when the part receives a thermal load applied thereto, the island projections do not peel off since the stress owing to the thermal expansion difference between the island projections and the substrate is small. In addition, the part has few closed pores, and it releases little gas.

The present invention is described in more detail with reference to the following Examples. However, it should be understood that the invention is not construed as being limited thereto.

EXAMPLE 1

Figure 2:
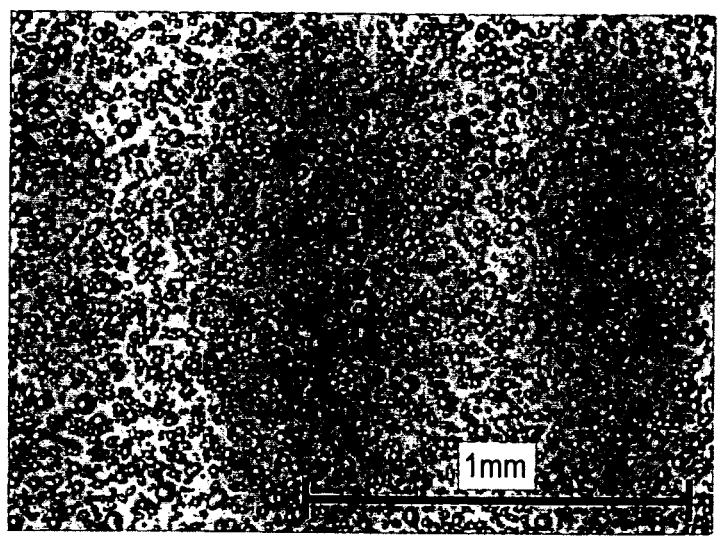
FIG. 2 is a picture of the top face of the sample of Example 1, taken through a scanning electron microscope.
Figure 3:
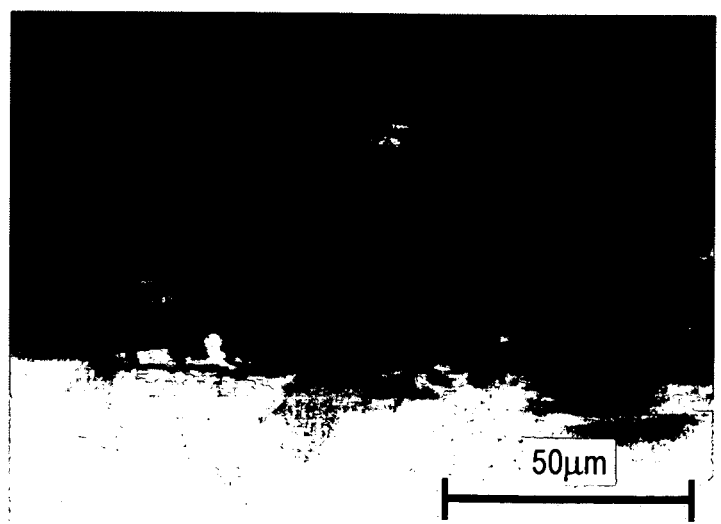
FIG. 3 is a picture of the cross section of the sample of Example 1, taken through a scanning electron microscope.

A multi-torch plasma spraying device as shown in FIG. 9 was used. Plasma gas 92 of nitrogen was led into the device at a rate of 5 SLM (standard litter per minute). Powder 93 was not fed into the device. The spray distance 94 was 80 mm. The spray gun gas moved at a rate of 80 mm/sec, and a thermal plasma was formed at a power of 20 kW. In that condition, the smooth surface of a quartz glass substrate 95 was preheated once. The length of the heat plasma was about 300 mm, and the plasma formed a laminar flow. Immediately after preheated with the plasma, the temperature of the preheated substrate was 820° C. A quartz glass powder having a mean particle size of 50 μm was sprayed once on the substrate at a feed rate of 1 g/min. The spray gun was moved at a rate of 100 mm/sec and at a pitch of 4 mm. A surface layer with island projections was thus formed on the substrate. The amount of the powder applied to the substrate corresponded to 5 mg/cm$^2$. The substrate thus having the island projections formed thereon was processed once again with plasma alone, for which the spray gun was moved at a rate of 120 mm/sec with no quartz glass powder applied to the substrate. Thus processed, the island projections and the substrate surface were melted and the matter having adhered to the island projections was re-melted, and the adhesiveness of the island projections to the quartz glass substrate was thereby enhanced. This was dipped in an aqueous 5% hydrofluoric acid for 30 minutes, then washed with ultra-pure water and dried in a clean oven. Its surface was observed with a microscope, and spherical island projections were found in the surface layer as shown in FIG. 2 and FIG. 3. Regarding the size of one projection, the width was from 5 to 50 μm and the height was from 5 to 60 μm, and the mean ratio of the height to the width was 1.0. The number of the projections was 180/mm². The surface roughness, Ra of the thus-modified substrate, measured with a tracer, was 12 µm.

EXAMPLE 2

Example 1 was followed, except that a quartz glass powder having a mean particle size of 20 µm was used. The surface of the surface-modified substrate was observed with a microscope, and spherical island projections were found in the surface layer. Regarding the size of one projection, the width was from 5 to 20 µm and the height was from 2 to 40 µm. The number of the projections was 3,000/mm². The surface roughness, Ra of the thus-modified substrate, measured with a tracer, was 5 µm.

EXAMPLE 3

A cut quartz glass substrate was preheated at 850° C., and a quartz glass powder was thermally sprayed repeatedly 6 times on it. The amount of the powder was 2 g/min; the spray distance was 80 mm; and the spray gun was moved at a rate of 80 mm/sec and at a pitch of 4 mm. A quartz glass-sprayed undercoat layer was thus formed on the quartz glass substrate.

The thus-undercoated substrate was once exposed to plasma alone by moving the spray gun at a rate of 80 mm/sec with no quartz glass powder applied to it, whereby the surface of the undercoat layer was re-melted. Thus processed, the quartz melt film of the undercoat layer had a smooth surface and had a thickness of about 300 µm. The substrate thus coated with the smooth undercoat layer was processed in the same manner as in Example 1 to form a surface layer of island projections thereon, for which, however, the powder supply was 2 g/min and the spray gun speed for re-melting the surface layer was 100 mm/sec.

Figure 5:
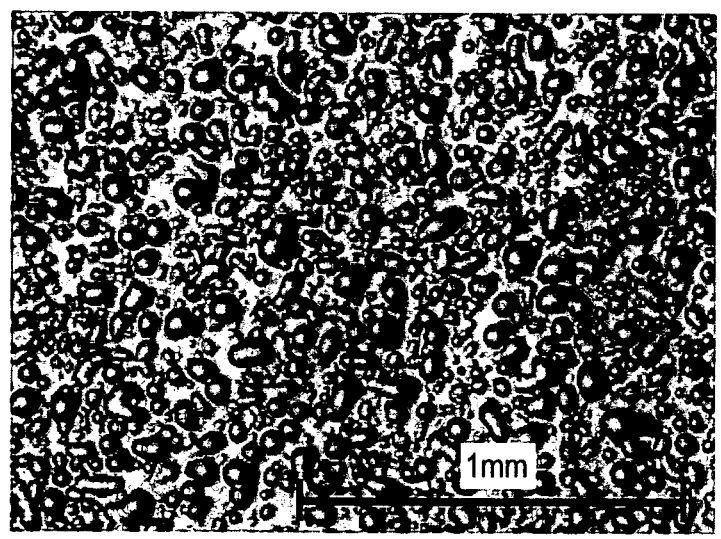
FIG. 5 is a picture of the top face of the sample of Example 3, taken through a scanning electron microscope.
Figure 6:
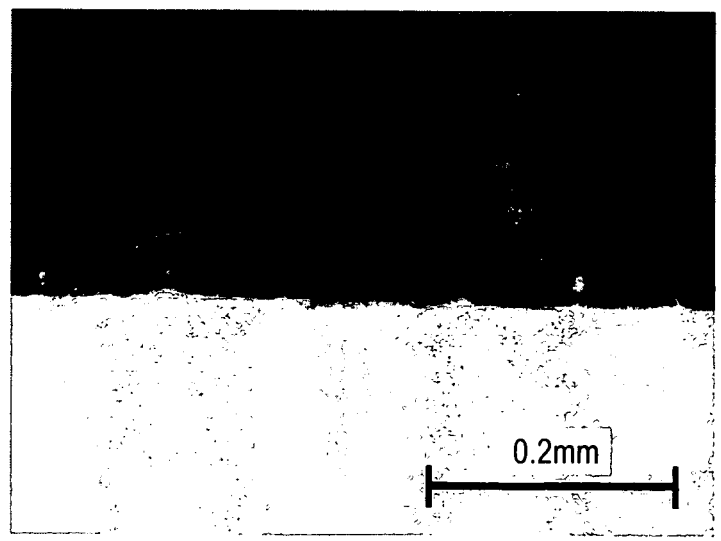
FIG. 6 is a picture of the cross section of the sample of Example 3, taken through a scanning electron microscope.

In this case, the powder supply to the substrate corresponded to 60 mg/cm² in the formation of the undercoat layer, and to 10 mg/cm² in the formation of the island projections. The surface of the thus-modified substrate was observed with a microscope, and a large number of spherical and bell-like projections were randomly found in the surface layer as shown in FIG. 5 and FIG. 6. Regarding the size of one projection, the width was from 10 to 150 µm and the height was from 10 to 100 µm, and the mean ratio of the height to the width was 0.6. The number of the projections was 150/mm². The surface roughness, Ra of the thus-modified substrate, measured with a tracer, was 20 µm.

EXAMPLE 4

Example 3 was followd, except that zircon ($ZrO_2 \cdot SiO_2$) was used for the substrate, and a quartz glass undercoat layer and island projections were formed on the substrate. The surface of the surface-modified substrate was observed with a microscope, and the thickness of the undercoat layer was 280 µm. A large number of spherical and bell-like projections were randomly found in the surface layer. Regarding the size of one projection, the width was from 10 to 150 µm and the height was from 10 to 100 µm, and the mean ratio of the height to the width was 0.7. The number of the projections was 170/mm². The surface roughness, Ra of the thus-modified substrate, measured with a tracer, was 25 µm.

EXAMPLE 5

Example 3 was followed, except that a stainless plate was used for the substrate, and a quartz glass undercoat layer and island projections were formed on the substrate. The surface of the surface-modified substrate was observed with a-microscope, and the thickness of the undercoat layer was 320 µm. A large number of spherical and bell-like projections were randomly found in the surface layer. Regarding the size of one projection, the width was from 20 to 160 µm and the height was from 20 to 100 µm, and the mean ratio of the height to the width was 0.6. The number of the projections was 200/mm². The surface roughness, Ra of the thus-modified substrate, measured with a tracer, was 23 µm.

EXAMPLE 6

Example 1 was followed, except that Vycor glass was used herein for the glass substrate and for the powder to be thermally sprayed on the substrate. The surface of the surface-modified substrate was observed with a microscope, and spherical island projections were found in the surface layer. Regarding the size of one projection, the width was from 5 to 50 µm and the height was from 5 to 55 µm, and the mean ratio of the height to the width was 1.1. The number of the projections was 200/mm². The surface roughness, Ra of the thus-modified substrate, measured with a tracer, was 10 µm.

EXAMPLE 7

Aluminosilicate glass was used for the glass substrate and for the powder to be thermally sprayed on the substrate. With no powder applied to it, the smooth surface of the aluminosilicate glass substrate was preheated once with thermal plasma of 20 kW power. For it, the spray distance was 120 mm, and the spray gun speed was 100 mm/sec and its pitch was 4 mm. Immediately after preheated with the plasma, the temperature of the preheated substrate was 500° C.

An aluminosilicate glass powder having a mean particle size of 50 µm was thermally sprayed once on the substrate through the spray gun running at a speed of 120 mm/sec at a feed rate of 1 g/min to form island projections thereon. Next, with no aluminosilicate glass powder applied thereto, the substrate was again exposed once to plasma alone from the spray gun running at a speed of 140 mm/sec whereby the surfaces of the substrate and the island projections were re-melted. This was dipped in an aqueous 5% hydrofluoric acid solution for 30 minutes, then washed with ultra-pure water, and dried in a clean oven. Its surface was observed with a microscope, and spherical and bell-like projections were randomly found in the surface layer. Regarding the size of one projection, the width was from 5 to 30 µm and the height was from 5 to 40 µm, and the mean ratio of the height to the width was 1.0. The number of the projections was 140/mm². The surface roughness, Ra of the thus-modified substrate, measured with a tracer, was 8 µm.

EXAMPLE 8

Island projections were pre-formed on the surface of a smooth quartz glass substrate through sol-gel reaction thereon, and these were thermally melted through plasma spraying thereon, whereby the pre-formed projections became smooth spherical or bell-like projections. A liquid mixture of silicon alkoxide $Si(OC_2H_5)_4$, alcohol $C_2H_5OH$, water $H_2O$ and hydrochloric acid HCl was prepared. A quartz powder having a mean particle size of 30 µm was added to the liquid mixture and well stirred and then kept statically as it was. The amount of the quartz powder added to the liquid mixture was 5% by weight of the mixture. When its viscosity reached 15 centipoises, the resulting mixture was further stirred so as to uniformly disperse the quartz powder therein. The quartz glass substrate was dipped in the quartz dispersion, and the pulled up at a pulling rate of 2 mm/sec. The quartz dispersion uniformly adhered to the substrate surface. Using the same plasma device as above, the thus-processed quartz substrate was exposed twice to thermal plasma of 20 kW power with no powder applied thereto. For it, the spray distance was 80 mm, and the spray gun was moved at a speed of 100 nm/sec and at a pitch of 4 mm. This was dipped in an aqueous 5% hydrofluoric acid solution for 30 minutes, then washed with ultra-pure water, and dried in a clean oven. The thickness of the surface layer formed was 40 µm. The surface of the thus-modified substrate was observed with a microscope, and a large number of spherical and bell-like projections were randomly found in the surface layer. Regarding the size of one projection, the width was from 5 to 50 µm and the height was from 5 to 40 µm, and the mean ratio of the height to the width was 0.9. The number of the projections was 250/mm$^2$. The surface roughness, Ra of the thus-modified substrate, measured with a tracer, was 8 µm.

COMPARATIVE EXAMPLE 1

The surface of a polished quartz glass substrate was blasted with a grid of white alumina #60 under a pressure of 0.5 MPa. This was dipped in an aqueous 5% hydrofluoric acid solution for 30 minutes, then washed with ultra-pure water, and dried in a clean oven. Its surface was observed with a microscope, and angularly roughened face was exhibited. When its cross section was observed, many microcracks were found. Measured with a tracer, its surface roughness, Ra was 13 µm.

COMPARATIVE EXAMPLE 2

Comparative Example 1 was followed, except that Vycor glass and aluminosilicate glass were used for the glass substrate. When the surface of the substrate processed herein was observed with a microscope, it was angularly roughened face and roughened and had microcracks, like in Comparative Example 1. Measured with a tracer, its surface roughness, Ra was 15 µm.

COMPARATIVE EXAMPLE 3

A surface-polished quartz glass substrate was dipped in a liquid mixture of aqueous hydrofluoric acid, ammonium fluoride and aqueous acetic acid. After thus processed with the chemical solution, the surface roughness Ra of the quartz glass substrate was 1.5 µm. Its surface was observed, but no microcracks were found therein.

EXAMPLE 9

This is to evaluate the ability of the samples to hold a deposit thereon. A silicon nitride film was directly formed on the samples of Examples 1 to 8 and Comparative Examples 1 to 3 through sputtering thereon, and the samples were tested for their ability to hold the film thereon. Specifically, the sputtering chamber was degassed to an ultimate vacuum of $5\times10^{-5}$ Pa, and a silicon target was sputtered toward the sample to form thereon a silicon nitride film of 150 µm thick at room temperature. The sputtering gas was a mixture of argon and nitrogen, and its pressure was 0.3 Pa. After thus coated, the samples were kept under atmospheric pressure for 1 day, and then inspected with a microscope. As a result, the samples of Examples 1 to 8 did not peel and gave no particles, but the samples of Comparative Examples 1 to 3 peeled.

EXAMPLE 10

Under the condition of Examples 1 to 3, Examples 6 to 8 or Comparative Examples 1 to 3, an inner wall of a quartz tube for an LPCVD film-forming device, a focus ring for a plasma-etching device, and a quartz bell jar for a plasma-cleaning device were constructed. These all receive a filmy deposit formed thereon while the devices are driven. With the sample fitted therein, the devices were driven for film formation and plasma treatment. When the bell jar constructed under the condition of Comparative Examples 1 to 3 was used, particles were found in the initial stage of the operation. In particular, the deposit having adhered to the bell jar of Comparative Example 3 peeled off while the device was driven. On the other hand, the parts constructed under the condition of Examples 1 to 3 and 6 to 8 did not release the deposit and gave no particles while the devices were continuously driven for 200 hours or more.

EXAMPLE 11

The samples of Examples 1 to 3 and Comparative Examples 1 to 3 were tested for their resistance to washing with acid. Specifically, the samples of Examples 1 to 3 and Comparative Examples 1 to 3 were dipped in a nitric acid/hydrofluoric acid washing liquid that had been prepared by mixing nitric acid (concentration 61%) and hydrofluoric acid (concentration 46%) in a ratio of 1/1. After 3 hours, the samples of Examples 1 to 3 were etched around the center of the sprayed film thereof, but their surface roughness was still on the same level as that before the dipping treatment. However, the surfaces of the samples of Comparative Examples 1 and 2 became flattened in some degree, and the surface roughness Ra of the sample of Comparative Example 3 lowered to 1.0 µm.

The quartz tube, the focus ring and the quartz bell jar that had been processed under the condition as above were actually tested as the inner wall of the quartz tube in an LPCVD film-forming device, as a focus ring in a plasma-etching device, and as a quartz bell jar in a plasma-cleaning device. The samples that had been constructed under the condition of Comparative Examples 1 and 2 gave particles in the initial stage of the test driving. The sample constructed under the condition of Comparative Example 3 released the deposit adhered thereto since its ability to hold the deposit lowered, and it gave particles. As opposed to these, however, the samples constructed under the condition of Examples 1 to 3 did not release the deposit and gave no particles while the devices were continuously driven for 200 hours or more.

EXAMPLE 12

A plasma spraying device as in FIG. 8 was used. Argon and hydrogen were used as the plasma gas 82, and the flow rate of argon was 35 SLM (standard litter per minute) and that of hydrogen was 10 SLM. Powder 83 was not fed into the device. The spray distance 94 was 100 mm. The spray gun gas moved at a rate of 400 mm/sec and at a pitch of 4 mm, and a heat plasma was formed at a power of 25 kW. In that condition, an alumina ceramic substrate 85 that had been pre-polished to have a surface roughness of 0.5 μm and a skewness of −0.3 was pre-heated twice. Immediately after preheated with the plasma, the temperature of the preheated substrate was 200° C. Next, an alumina powder having a mean particle size of 20 μm was sprayed once on the substrate at a feed rate of 8 g/min. The spray gun was moved at a rate of 400 mm/sec and at a pitch of 4 mm, and the plasma power was 25 kW. A surface layer with island projections was thus formed on the substrate. After thus sprayed, the substrate was put into a heating furnace and heated therein at 1,300° C. for 1 hour. Before the heat treatment, the surface layer peeled off when it was picked up with tweezers, but after the heat treatment, it did not peel off but firmly adhered to the substrate. The finished sample was ultrasonically washed in pure water and dried, and its surface was observed with a microscope. Bell-like island projections were found on the surface layer. Regarding the size of one projection, the width was from 10 to 40 μm and the height was from 4 to 30 μm, and the mean ratio of the height to the width was 0.4. The number of the projections was 1800/mm². The surface roughness, Ra of the thus-modified substrate, measured with a tracer, was 4 μm. The cross section of the island projections was polished and observed with a polarizing microscope, and something like a nucleus was found in the center part of almost all the island projections. This confirms that the peripheral part of the sprayed particles melted but the center part thereof was kept un-melted to give the island projections.

COMPARATIVE EXAMPLE 4

A surface layer was formed under the same condition as in Example 12, for which, however, the spray power was 35 kW and the preheating temperature was 250° C. Its surface was observed with a microscope, and flat island projections were found on the surface layer. Regarding the size of one projection, the width was from 15 to 80 μm and the height was from 2 to 20 μm, and the mean ratio of the height to the width was 0.1. The number of the projections was 3,500/mm². The surface roughness, Ra of the thus-modified substrate, measured with a tracer, was 3 μm. The cross section of the island projections was polished and observed with a polarizing microscope, and no nucleus was found in most of the island projections. This means that the sprayed particles almost completely melted to their center to give the projections.

COMPARATIVE EXAMPLE 5

A continuous melt-spray film having a thickness of 140 μm was formed under the same thermal spraying condition as in Example 12, for which, however, the alumina powder supply amount was 30 g/min and the spray power was 25 kW. After thus coated, the substrate was put into a heating furnace and heated therein at 1,300° C. for 1 hour. Thus heated, the coating film was deformed and a part of it was greatly cracked.

EXAMPLE 13

A sample was produced under the same condition as in Example 12, for which, however, the spray power was 30 kW, the preheating temperature was 220° C. and an alumina powder having a mean particle size of 60 μm was used. Its surface was observed with a microscope, and bell-like island projections were found on its surface layer. Regarding the size of one projection, the width was from 30 to 100 μm and the height was from 20 to 120 μm, and the mean ratio of the height to the width was 1.0. The number of the projections was 300/mm². The surface roughness, Ra of the thus-modified substrate, measured with a tracer, was 10 μm. The cross section of the island projections was polished and observed with a polarizing microscope, and something like a nucleus was found in the center part of almost all the island projections. This confirms that the center part of the sprayed particles was kept un-melted to give the island projections.

EXAMPLE 14

A sample was produced under the same condition as in Example 12, for which, however, a stainless substrate that had been finished with a grinder to have a surface roughness Ra of 1 μm and a skewness of −0.5 was used, the spray power was 27 kW, the preheating temperature was 200° C. and a zircon powder having a mean particle size of 30 μm was used. Its surface was observed with a microscope, and bell-like island projections were found on its surface layer. Regarding the size of one projection, the width was from 15 to 60 μm and the height was from 6 to 45 μm, and the mean ratio of the height to the width was 0.5. The number of the projections was 900/mm². The surface roughness, Ra of the thus-modified substrate, measured with a tracer, was 6 μm. The cross section of the island projections was polished and observed with a polarizing microscope, and something like a nucleus was found in the center part of almost all the island projections. This confirms that the center part of the sprayed particles was kept un-melted to give the island projections.

EXAMPLE 15

A plasma spraying device as in FIG. 8 was used herein. As the plasma gas 82, argon was led into the device at a flow rate of 50 SLM. Powder 83 was not fed into the device. The spray distance 84 was 100 mm. The spray gun gas moved at a rate of 400 mm/sec and at a pitch of 4 mm, and a heat plasma was formed at a power of 20 kW. In that condition, a stainless substrate 85 that had been pre-polished to have a surface roughness of 0.3 μm and a skewness of −0.2 was pre-heated twice. Immediately after preheated with the plasma, the temperature of the preheated substrate was 170° C. A molybdenum powder having a mean particle size of 40 μm was sprayed once on the substrate at a feed rate of 10 g/min. The spray gun was moved at a rate of 400 mm/sec and at a pitch of 4 mm, and the plasma power was 20 kW. A surface layer with island projections was thus formed on the substrate. After thus sprayed, the substrate was put into a heating furnace and heated therein at 600° C. for 1 hour. The finished sample was ultrasonically washed in pure water and dried, and its surface was observed with a microscope. Bell-like island projections were found on the surface layer. Regarding the size of one projection, the width was from 30 to 80 μm and the height was from 10 to 70 μm, and the mean ratio of the height to the width was 0.7. The number of the projections was 800/mm². The surface roughness, Ra of the thus-modified substrate, measured with a tracer, was 6 μm. The cross section of the island projections was polished and observed with a polarizing microscope, and something like a nucleus was found in the center part of almost all the island projections. This confirms that the center part of the sprayed particles was kept un-melted to give the island projections.

COMPARATIVE EXAMPLE 6

A surface layer was formed under the same condition as in Example 15, for which, however, the spray power was 30 kW and the preheating temperature was 200° C. Its surface was observed with a microscope, and flat island projections were found on the surface layer. Regarding the size of one projection, the width was from 50 to 150 μm and the height was from 5 to 15 μm, and the mean ratio of the height to the width was 0.1. The number of the projections was 1,200/mm². The surface roughness, Ra of the thus-modified substrate, measured with a tracer, was 3 μm. The cross section of the island projections was polished and observed with a polarizing microscope, and no nucleus was found in most of the island projections. This means that the sprayed particles almost completely melted to their center to give the projections.

COMPARATIVE EXAMPLE 7

A continuous melt-spray film having a thickness of 160 μm was formed under the same condition as in Example 15, for which, however, the molybdenum powder supply amount was 30 g/min and the spray power was 20 kW.

EXAMPLE 16

A plasma spraying device as in FIG. 8 was used herein. As the plasma gas 82, argon was led into the device at a flow rate of 50 SLM. Powder 83 was not fed into the device. The spray distance 84 was 80 mm. The spray gun gas moved at a rate of 400 mm/sec and at a pitch of 4 mm, and a heat plasma was formed at a power of 25 kW. In that condition, a stainless substrate 85 that had been pre-polished and smoothed to have a surface roughness of 0.1 μm was pre-heated twice. Immediately after preheated with the plasma, the temperature of the preheated substrate was 200° C.

A powder of 20 wt. % Co-coated, sintered spherical particles of tungsten carbide having a mean particle size of 30 μm was sprayed once on the substrate at a feed rate of 10 g/min. The spray gun was moved at a rate of 400 mm/sec and at a pitch of 4 mm, and the plasma power was 22 kW. A surface layer with island projections was thus formed on the substrate. After thus sprayed, the substrate was put into a heating furnace and heated therein at 600° C. for 1 hour. The finished sample was ultrasonically washed in pure water and dried, and its surface was observed with a microscope. Bell-like island projections were found on the surface layer. Regarding the size of one projection, the width was from 30 to 90 μm and the height was from 15 to 90 μm, and the mean ratio of the height to the width was 0.8. The number of the projections was 600/mm². The surface roughness, Ra of the thus-modified substrate, measured with a tracer, was 7 μm. The cross section of the island projections was polished and observed with a polarizing microscope, and something like a nucleus was found in the center part of almost all the island projections. This confirms that the center part of the sprayed particles of tungsten carbide was kept un-melted to give the island projections.

EXAMPLE 17

This is to evaluate the ability of the samples to hold a deposit thereon. A silicon nitride film was directly formed on the samples of Examples 12 to 16 and Comparative Examples 4 and 6 through sputtering thereon, and the samples were tested for their ability to hold the film thereon. Specifically, the sputtering chamber was degassed to an ultimate vacuum of $5 \times 10^{-5}$ Pa, and a silicon target was sputtered toward the sample to form thereon a silicon nitride film of 100 μm thick at room temperature. The sputtering gas was a mixture of argon and nitrogen, and its pressure was 0.3 Pa. After thus coated, the samples were kept under atmospheric pressure for 1 day, then heated at 600° C. for 1 hour and thereafter cooled to room temperature, and then inspected with a microscope. As a result, the samples of Examples 12 to 16 did not peel and gave no particles, but the samples of Comparative Examples 4 and 6 peeled.

EXAMPLE 18

Under the condition of Examples 12 and 13 and Comparative Examples 4 and 5, quartz bell jars for plasma-cleaning devices, which receive a filmy deposit formed thereon, were constructed and used in plasma treatment. Example 12 and Comparative Example 5 were compared with each other in point of the degassing time therein. In Example 12, the time taken to reach the ultimate vacuum was ⅔ of that in Comparative Example 5. On the other hand, the time taken before the filmy deposit formed on the bell jars of Examples 12 and 13 began to peel after the device began to run was at least 2 times longer than that taken with the bell jar of Comparative Example 5.

EXAMPLE 19

Under the condition of Examples 14 to 16 and Comparative Examples 6 and 7, upper shields for PVD devices, which receive a filmy deposit of TiN formed thereon, were constructed and used in wafer formation. Example 15 and Comparative Example 7 were compared with each other in point of the degassing time therein. In Example 15, the time taken to reach the ultimate vacuum was a half of that in Comparative Example 7. On the other hand, the time taken before the filmy deposit formed on the upper shields of Examples 14 to 16 began to peel after the device began to run was at least 2 times longer than that taken with the upper shield of Comparative Example 6.

What is claimed is:

1. An island projection-modified part which has, on the substrate thereof, island projections having a width of from 5 to 300 μm and a height of from 2 to 200 μm and in which the island projections are roundish as a whole, and the number of the island projections is from 20 to 5,000/mm², wherein the island projections are formed of glass and they are spherical, partly spherical, semispherical, bell-shaped or mountain-shaped or are in the form of a mixture of two or more of these shapes and wherein at least some island projections do not overlap with each other, whereby a portion of the substrate is exposed and separates at least some of the individual island projections, and wherein the glass which constitutes the island projections is exposed on the surface.

2. An island projection-modified part which has, on the substrate thereof, island projections having a width of from 5 to 300 μm and a height of from 2 to 200 μm and in which the island projections are roundish as a whole, and the number of the island projections is from 20 to 5,000/mm², wherein the island projections are formed of glass and they are spherical, partly spherical, semispherical, bell-shaped or mountain-shaped or are in the form of a mixture of two or more of these shapes, wherein the island projections are formed on a glass-sprayed film that is formed on the substrate and wherein at least some island projections do not overlap with each other, whereby a portion of the substrate is exposed and separates at least some of the individual island projections, and wherein the glass which constitutes the island projections is exposed on the surface.

3. An island projection-modified part which has, on the substrate thereof, island projections which are formed of glass and which have a width of from 5 to 300 μm and a height of from 2 to 200 μm and in which the island projections are roundish as a whole and do not have any sharp edge, and the number of the island projections is from 20 to 5,000/mm$^2$, wherein at least some island projections do not overlap with each other, whereby a portion of the substrate is exposed and separates at least some of the individual island projections, and wherein the glass which constitutes the island projections is exposed on the surface.

4. The island projection-modified part as claimed in claim 1, wherein the glass to form the island projections is quartz glass.

5. The island projection-modified part as claimed in claim 2, wherein the sprayed film is of quartz glass.

6. A film-forming device that comprises the island projection-modified part of claim 1.

7. A plasma-etching device wherein the island projection-modified part of claim 1 is used for the part on which a film may be deposited or etched through plasma etching.

8. A plasma-cleaning device wherein the island projection-modified part of claim 1 is used for the part on which a film may be deposited or etched through back sputtering.

9. The island projection-modified part as claimed in claim 3, wherein the island projections are formed of ceramic and/or metal, and they are mountain-shaped and/or bell-shaped.

10. The island projection-modified part as claimed in claim 1, wherein the mean ratio of the height to the width (height/width) of the island projections falls between 0.3 and 1.5.

11. The island projection-modified part as claimed in claim 9, wherein the surface of the substrate on which the island projections are formed has a surface roughness Ra of at most 5 μm.

12. The island projection-modified part as claimed in claim 9, wherein the island projections are formed of materials having a different melting point and the material having a high melting point is enveloped in the other material having a low melting point to give the island projections.

13. A film-forming device wherein the part of claim 9 is used for the part that may receive a filmy deposit formed thereon through PVD or CVD.

14. A plasma-etching device wherein the part of claim 9 is used for the part on which a film may be deposited or etched through plasma etching.

15. A plasma-cleaning device wherein the part of claim 9 is used for the part on which a film may be deposited or etched through back sputtering.

16. The island projection-modified part as claimed in claim 3, wherein the mean ratio of the height to the width (height/width) of the island projections falls between 0.3 and 1.5.

17. The island projection-modified part as claimed in claim 2, wherein the glass-sprayed film formed on the substrate is smooth and does not have pores with a size of 100 μm or more.

* * * * *